(12) United States Patent
Murakoshi et al.

(10) Patent No.: US 8,547,182 B2
(45) Date of Patent: Oct. 1, 2013

(54) OVEN CONTROLLED CRYSTAL OSCILLATOR

(75) Inventors: Hiroyuki Murakoshi, Sayama (JP); Kenji Kasahara, Sayama (JP); Daisuke Nishiyama, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 36 days.

(21) Appl. No.: 13/253,394

(22) Filed: Oct. 5, 2011

(65) Prior Publication Data

US 2012/0086516 A1 Apr. 12, 2012

(30) Foreign Application Priority Data

Oct. 8, 2010 (JP) ................. P.2010-228600
Oct. 8, 2010 (JP) ................. P.2010-228603

(51) Int. Cl.
*H03B 5/32* (2006.01)
*H03B 1/02* (2006.01)

(52) U.S. Cl.
USPC .................. 331/158; 331/108 D; 331/69

(58) Field of Classification Search
USPC ............ 331/158, 116 R, 116 FE, 68, 69, 331/108 D
See application file for complete search history.

(56) References Cited

U.S. PATENT DOCUMENTS

| 6,208,213 | B1 * | 3/2001 | Anastasyev et al. | 331/69 |
| 7,345,552 | B2 * | 3/2008 | Ito et al. | 331/69 |
| 7,479,835 | B2 * | 1/2009 | Mitome et al. | 331/69 |
| 2010/0025841 | A1 * | 2/2010 | Kakegawa | 257/692 |

FOREIGN PATENT DOCUMENTS

| JP | S62-037428 | | 3/1987 |
| JP | 04338599 A | * | 11/1992 |
| JP | 08-237031 | | 9/1996 |
| JP | 2006-014208 | | 1/2006 |
| JP | 2007-214307 | | 8/2007 |
| JP | 2009-284372 | | 12/2009 |

* cited by examiner

*Primary Examiner* — Ryan Johnson
(74) *Attorney, Agent, or Firm* — Jacobson Holman PLLC (57) ABSTRACT

Provided is an oven controlled crystal oscillator which can reduce an occurrence of cracks in an applied solder of a large-sized circuit component and improve reliability. It is an oven controlled crystal oscillator in which a slit is formed in a periphery or below a lower surface of a large-sized circuit component provided on the substrate, further, a plurality of small-sized circuit components, which are smaller than the large-sized circuit component, are disposed around the large-sized circuit component, as necessary, and for the plurality of small-sized circuit components, an electronic component, which is electrically connected, and a dummy electronic component, which is not electrically connected, are used.

7 Claims, 7 Drawing Sheets

OVEN CONTROLLED CRYSTAL OSCILLATOR

This application has a priority of Japanese no. 2010-228600 and no. 2010-228603 filed Oct. 8, 2010, hereby incorporated by reference.

BACKGROUND OF THE INVENTION

1. Field of the Invention

The present invention relates to an oven controlled crystal oscillator (OCXO: Oven Controlled Crystal Oscillator), more particularly to an oven controlled crystal oscillator which, when a circuit component is soldered on a substrate, reduces an occurrence of cracks in the solder and improves reliability.

2. Description of the Related Art

[Prior Art]

In order to increase frequency stability, an oven controlled crystal oscillator attempts to stabilize frequency by controlling, in a thermostatic oven, the temperature of components having a large temperature effect in a wide temperature range.

The temperature control in the oven controlled crystal oscillator is generally carried out such that a control circuit that controls a thermostatic oven carries out temperature control with a differential direct-current amplifier by a resistance bridge using a thermistor. When on/off of a power source of the thermostatic oven is repeated, a heat cycle is burdened on a using part/material, which causes a problem in reliability.

Figure 13:
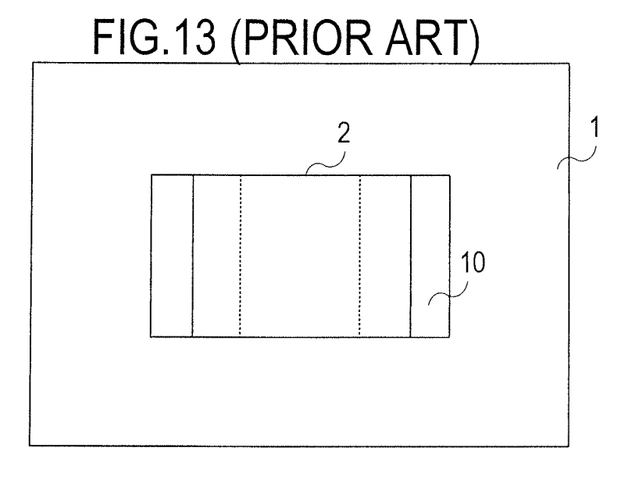
FIG. 13 is a plane explanatory view in which a large-sized circuit component is mounted.
Figure 14:
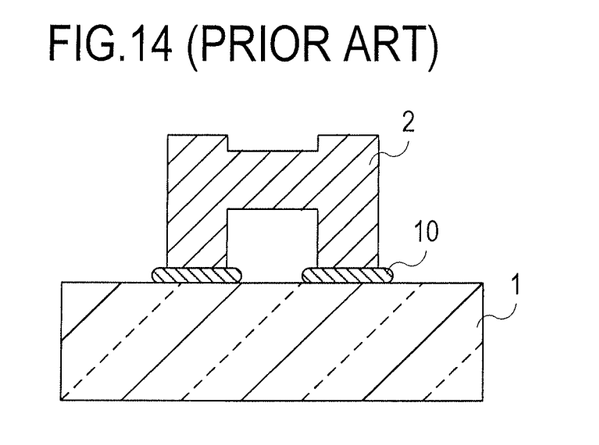
FIG. 14 is a cross-sectional explanatory view in which a large-sized circuit component is mounted.

[Circuit Component Mount Example: FIG. 13, FIG. 14]

Explained is a conventional case where a large circuit component (a large-sized circuit component) is mounted on a substrate of a crystal oscillator, with reference to FIG. 13 and FIG. 14. FIG. 10 is a planar explanatory view of a state where a large-sized circuit component is mounted, and FIG. 14 is a cross-sectional explanatory view of the state where a large-sized circuit component is mounted.

As shown in FIG. 13 and FIG. 14, a large circuit component (a large-sized circuit component) 2 is fixed by a solder 10 on a substrate 1 made of a glass epoxy resin.

Note that, FIG. 13 and FIG. 14 are simplified views in which a single large-sized circuit component 2 is mounted on a small substrate 1, for convenience of explanation. However, on a real substrate 1, a crystal oscillator, a plurality of large and small circuit components, and the like are mounted.

[Related Art]

Note that, as related prior art technology, there are the followings: Japanese Patent Application Laid-Open No. 2007-214307, "Electronic Device," (EPSON TOYOCOM CORPORATION) [Patent Document 1]; Japanese Patent Application Laid-Open No. 08-237031, "Piezoelectric Oscillator," (Kinseki Co., Ltd.) [Patent Document 2]; Japanese Utility Model Application Laid-Open No. 62-037428, "Piezoelectric Oscillator," (Kinseki Co., Ltd) [Patent Document 3]; Japanese Patent Application Laid-Open No. 2006-014208, "Crystal Oscillator," (NIHON DEMPA KOGYO CO., LTD.) [Patent Document 4]; and Japanese Patent Application Laid-Open No. 2009-284372, "Constant Temperature Structure of Crystal Oscillator," (NIHON DEMPA KOGYO CO., LTD.) [Patent Document 5].

Patent Document 1 discloses that in an electronic device, an opening 38 and a slit portion 40 are provided on a substrate 30 on an underside of an electronic component to reduce an occurrence of cracks in a sealant 12 due to air expansion.

Patent Document 2 discloses that in a piezoelectric oscillator, a slit 5 is formed to surround an oscillation circuit component 3 disposed on a substrate 4, thereby making it possible to reduce diffusion of heat to other parts.

Patent Document 3 discloses that in a piezoelectric oscillator, a slit-shaped open hole part 16 is formed on a substrate 14 as shown in FIG. 1, so as to restrain a malfunction caused by a difference in an expansion coefficient and to improve frequency temperature behavior.

Patent Document 4 discloses that in a crystal oscillator, band-shaped heating means constituted by a resistance heat generation layer is provided so as to surround an interior region of a substrate along a periphery of the substrate.

Patent Document 5 discloses that in an oven controlled oscillator, a chip resistor 3a for heating is disposed on a blank space 13 of a circuit board 4, which is on a bottom-surface side of a crystal oscillator, a main surface of the chip resistor 3a, on which a resistance coating is formed, is placed so as to face the bottom surface of the crystal oscillator, and the crystal oscillator is disposed on a substrate 4 so as to cover the blank space 13.

[Patent Document 1] Japanese Patent Application Laid-Open No. 2007-214307

[Patent Document 2] Japanese Patent Application Laid-Open No. 08-237031

[Patent Document 3] Japanese Utility Model Application Laid-Open No. 62-037428

[Patent Document 4] Japanese Patent Application Laid-Open No. 2006-014208

[Patent Document 5] Japanese Patent Application Laid-Open No. 2009-284372

SUMMARY OF THE INVENTION

However, the conventional crystal oscillators have such a problem that in a case where a glass epoxy resin is used for a circuit substrate, since there is a difference in a linear expansion coefficient between a circuit component of an electronic component using ceramic, which is to be mounted on the substrate, for example, and a glass epoxy resin material, a distortion centers on an applied solder in an operating environment in which a heat cycle occurs, thereby causing cracks in the solder.

Here, as to the linear expansion coefficient of the glass epoxy resin material, for a common CEM (Composite Epoxy Material)-3, the coefficient is 25 ppm/° C. in a longitudinal direction, 28 ppm/° C. in a lateral direction, and 65 ppm/° C. in a thickness direction. For a common FR (Flame Retardant)-4, the coefficient is 13 ppm/° C. in a longitudinal direction, 16 ppm/° C. in a lateral direction, and 60 ppm/° C. in a thickness direction.

Further, the linear expansion coefficient of ceramic (alumina base material) is 7 ppm/° C.

Note that it is known that cracks in a solder generally occur in a large circuit component rather than a small circuit component. However, some circuit components cannot be downsized in view of performance and the fixed number of components, and there are a lot of cases that a large circuit component should be used.

Particularly, oven controlled crystal oscillators (OCXO) have such a problem that in an operating environment in which on/off of a power supply is repeated, that is, an operating environment in which a heat cycle occurs, since a temperature change from ambient temperature to thermostatic-oven-controlling temperature (e.g., 85° C.) is caused, cracks occur in an applied solder of a large-sized circuit component, and thereby resulting in that reliability cannot be improved.

Further, Patent Document 1 intends to reduce an occurrence of cracks in the sealant 12 due to air expansion, but it does not reduce an occurrence of cracks in an applied solder of a large-sized circuit component.

Furthermore, in Patent Document 2, the slit 5 prevents that heat spreads to other parts, but it does not reduce an occurrence of cracks in an applied solder of a large-sized circuit component.

Moreover, in Patent Document 3, the slit-shaped open hole part is formed to restrain a malfunction caused by a difference in an expansion coefficient and to improve frequency temperature behavior. However, the position and the like of the open hole part are not devised to reduce an occurrence of cracks in an applied solder of a large-sized circuit component.

Also, in Patent Documents 4 and 5, the heating means and a temperature control element are provided around the substrate, but a reduction in the occurrence of cracks in an applied solder of a large-sized circuit component is not considered.

The present invention is accomplished in view of the above situations, and an object of the present invention is to provide an oven controlled crystal oscillator which can reduce the occurrence of cracks in an applied solder of a large-sized circuit component and improve reliability.

In order to solve the problems of the conventional examples, the present invention is such that in an oven controlled crystal oscillator, a circuit component is provided on a substrate, and L-shaped slits are provided on the substrate so as to individually surround four corners of the circuit component. Thus, the present invention has such an effect that an occurrence of cracks in an applied solder of the circuit component can be reduced and reliability can be improved.

The present invention is such that in an oven controlled crystal oscillator, a circuit component is provided on a substrate, slits are provided on the substrate in parallel along outsides of long sides of the circuit component, and another slit is provided so as to connect the slits, which are provided in parallel, with each other below the circuit component. Thus, the present invention has such an effect that an occurrence of cracks in an applied solder of the circuit component can be reduced and reliability can be improved.

The present invention is such that in an oven controlled crystal oscillator, a circuit component is provided on a substrate, and slits are provided on the substrate along outsides of four sides of the circuit component. Thus, the present invention has such an effect that an occurrence of cracks in an applied solder of the circuit component can be reduced and reliability can be improved.

The present invention is such that in an oven controlled crystal oscillator, a circuit component is provided on a substrate, and slits are provided on the substrate along outsides of short sides of the circuit component.

The present invention is such that in an oven controlled crystal oscillator, a circuit component is provided on a substrate, and slits are provided on the substrate along outsides of long sides of the circuit component.

The present invention is such that in the oven controlled crystal oscillator, small-sized circuit components, which are smaller than the circuit component, are disposed on the substrate along outsides of short sides of the circuit component.

The present invention is such that in the oven controlled crystal oscillator, small-sized circuit components, which are smaller than the circuit component, are disposed on the substrate along outsides of long sides of the circuit component.

The present invention is such that in an oven controlled crystal oscillator, a circuit component is provided on a substrate, a slit is provided on the substrate below the circuit component, and small-sized circuit components, which are smaller than the circuit component, are disposed along outsides of short sides or long sides, or outsides of short and long sides of the circuit component.

The present invention is such that in an oven controlled crystal oscillator, a circuit component is provided on a substrate, short-side portions of the circuit component are soldered to be fixed to the substrate, and slits are provided on the substrate at a center of and below the circuit component in parallel with the short sides.

The present invention is characterized in that in the oven controlled crystal oscillator, the slits have a width of not more than 1.5 mm (for example, 0.6 mm to 0.8 mm).

Further, the present invention is such that in an oven controlled crystal oscillator, a circuit component is provided on a substrate, a plurality of small-sized circuit components, which are smaller than the circuit component, are disposed around the circuit component (large-sized circuit component), and for the plurality of small-sized circuit components, an electronic component, which is electrically connected, and a dummy electronic component, which is not electrically connected, are used. Thus, the present invention has such an effect that it is possible to reduce an occurrence of cracks in an applied solder of the circuit component, which is larger than the small-sized circuit components, and to improve reliability.

The present invention is such that in the oven controlled crystal oscillator, a distance between the large-sized circuit component and each of the small-sized circuit components is 0.05 mm to 1 mm.

The present invention is such that in the oven controlled crystal oscillator, a distance between the large-sized circuit component and each of the small-sized circuit components is 0.1 mm to 0.3 mm.

The present invention is such that in the oven controlled crystal oscillator, the small-sized circuit components are disposed along long sides of the large-sized circuit component.

The present invention is such that in the oven controlled crystal oscillator, in an area where there is no space to dispose any small-sized circuit components, slits are provided instead of disposing the small-sized circuit components. Thus, the present invention has such an effect that even in a case where there is no space to dispose any small-sized circuit components, an occurrence of cracks in an applied solder of the large-sized circuit component can be reduced and reliability can be improved.

The present invention is such that in the oven controlled crystal oscillator, the small-sized circuit components are ceramic capacitors or ceramic resistors.

The present invention is such that in the oven controlled crystal oscillator, the large-sized circuit component around which the small-sized circuit components are disposed is a capacitor, a resistor, an inductor, a thermistor, a semiconductor or a crystal resonator.

DESCRIPTION OF REFERENCE NUMERALS

1 . . . . Substrate, 2 . . . . Large-sized Circuit Component, 3a, 3b, 3c, 3d, 3e . . . . Slit, 4a, 4b . . . . Small-sized Circuit Component, 10 . . . . Solder, 13a, 13b . . . . Small-sized Circuit Component, 14a, 14b . . . . Slit

DESCRIPTION OF THE PREFERRED EMBODIMENT

Embodiments of the present invention are described with reference to drawings.

[Summary of Preferred Embodiment]

An oven controlled crystal oscillator according to an embodiment of the present invention is such that a slit is formed in a periphery or below a lower surface of a circuit component (a large-sized circuit component) provided on a substrate, further, a plurality of small-sized circuit components, which are smaller than the large-sized circuit component, are disposed around the large-sized circuit component, as necessary, and for the plurality of small-sized circuit components, an electronic component, which is electrically connected, and a dummy electronic component, which is not electrically connected, are used. Thus, the oven controlled crystal oscillator can reduce an occurrence of cracks in an applied solder of the large-sized circuit component and improve reliability.

Further, an oven controlled crystal oscillator according to an embodiment of the present invention is such that around a large-sized circuit component provided on a substrate, a plurality of small-sized circuit components, which are smaller than the circuit component, are disposed, and for the plurality of small-sized circuit components, an electronic component, which is electrically connected, and a dummy electronic component, which is not electrically connected, are used. Thus, the oven controlled crystal oscillator can reduce an occurrence of cracks in an applied solder of the large-sized circuit component and improve reliability.

Figure 1:
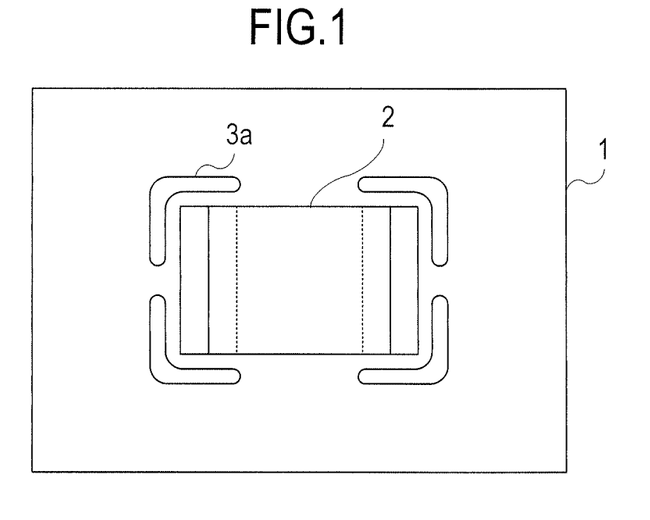
FIG. 1 is a plane explanatory view of a circuit component provided on a substrate of an oven controlled crystal oscillator according to the first embodiment.

[First Embodiment: FIG. 1]

An oven controlled crystal oscillator according to the first embodiment of the present invention is described with reference to FIG. 1. FIG. 1 is a plane explanatory view of a circuit component provided on a substrate of the oven controlled crystal oscillator according to the first embodiment.

In FIG. 1, for convenience of explanation, a single circuit component (a large-sized circuit component) 2 is mounted on a small substrate 1, so that the figure is simplified. However, on an actual substrate 1, a crystal resonator, a plurality of large and small circuit components, and the like are mounted. Similarly, FIGS. 2 to 8 also describe drawings in a similar purpose.

A substrate of the oven controlled crystal oscillator (the first oscillator) according to the first embodiment is configured such that as shown in FIG. 1, a large circuit component (a large-sized circuit component) 2 is mounted, by soldering, on the substrates 1 made of a glass epoxy resin or the like, and L-shaped slits 3a are provided on the substrate so as to individually surround four corners of the large-sized circuit component 2.

The large-sized circuit component 2 is a capacitor, a resistor, an inductor, a thermistor, a semiconductor or a crystal resonator, and is fixed to the substrate 1 by soldering.

More specifically, as shown in FIGS. 13 and 14, the soldering is performed on pedal parts of the large-sized circuit component 2.

The slits 3a have a width of around 0.1 mm to 1.5 mm, for example. In view of the present circuit scale, a width of around 0.6 mm to 0.8 mm is reasonable, and they are formed to penetrate through the substrate 1. Slits in the following embodiments also have equivalent widths.

Due to the slits 3a formed on the substrate 1, a distortion of the substrate 1 by a heat cycle is relaxed. This can reduce an occurrence of cracks in an applied solder of the large-sized circuit component and improve reliability.

Figure 2:
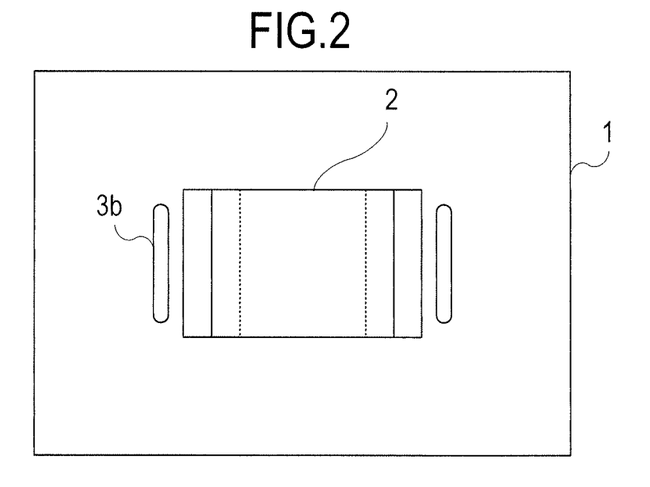
FIG. 2 is a plane explanatory view of a circuit component provided on a substrate of an oven controlled crystal oscillator according to the second embodiment.

[Second Embodiment: FIG. 2]

Next, an oven controlled crystal oscillator (the second oscillator) according to the second embodiment is described with reference to FIG. 2. FIG. 2 is a plane explanatory view of a circuit component provided on a substrate of the oven controlled crystal oscillator according to the second embodiment.

As shown in FIG. 2, a large-sized circuit component 2 is soldered on a substrate 1 of the second oscillator, and slits 3b are formed in parallel along short sides of the large-sized circuit component 2.

Even due to the slits 3b, a distortion of the substrate 1 by a heat cycle is relaxed. This can also reduce an occurrence of cracks in an applied solder of the large-sized circuit component 2 and improve reliability.

Figure 3:
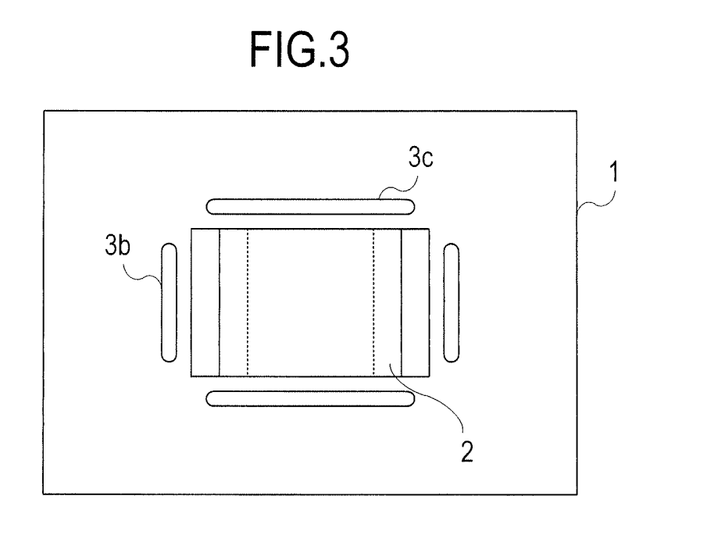
FIG. 3 is a plane explanatory view of a circuit component provided on a substrate of an oven controlled crystal oscillator according to the third embodiment.

[Third Embodiment: FIG. 3]

Then, an oven controlled crystal oscillator (the third oscillator) according to the third embodiment is described with reference to FIG. 3. FIG. 3 is a plane explanatory view of a circuit component provided on a substrate of the oven controlled crystal oscillator according to the third embodiment.

As shown in FIG. 3, a large-sized circuit component 2 is soldered on a substrate 1 of the third oscillator, and slits 3b and 3c are formed in parallel, respectively, along short sides and long sides of the large-sized circuit component 2.

Due to the slits 3b and 3c, a distortion of the substrate 1 by a heat cycle is relaxed, thereby resulting in that an occurrence of cracks in an applied solder of the large-sized circuit component 2 can be reduced and reliability can be improved.

Figure 4:
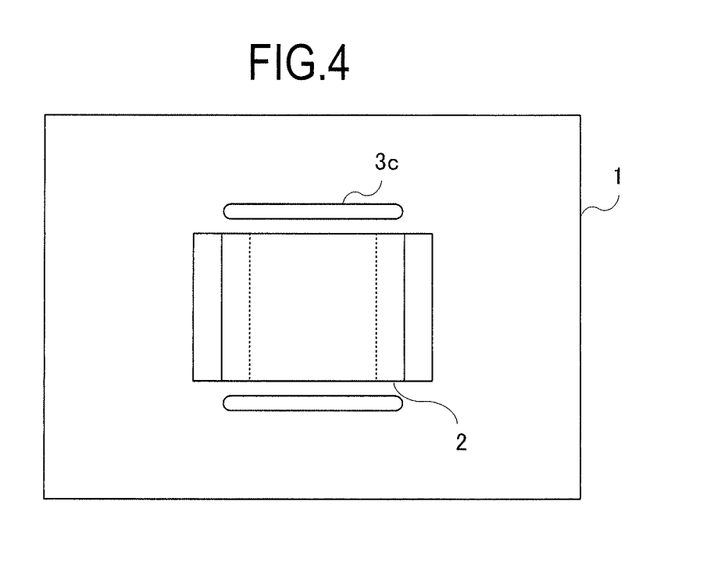
FIG. 4 is a plane explanatory view of a circuit component provided on a substrate of an oven controlled crystal oscillator according to the fourth embodiment.

[Fourth Embodiment: FIG. 4]

Next, an oven controlled crystal oscillator (the fourth oscillator) according to the fourth embodiment is described with reference to FIG. 4. FIG. 4 is a plane explanatory view of a circuit component provided on a substrate of the oven controlled crystal oscillator according to the fourth embodiment.

As shown in FIG. 4, a large-sized circuit component 2 is soldered on a substrate 1 of the fourth oscillator, and slits 3c are formed in parallel along long sides of the large-sized circuit component 2.

Due to the slits 3c, a distortion of the substrate 1 by a heat cycle is relaxed, thereby resulting in that an occurrence of cracks in an applied solder of the large-sized circuit component 2 can be reduced and reliability can be improved.

Figure 5:
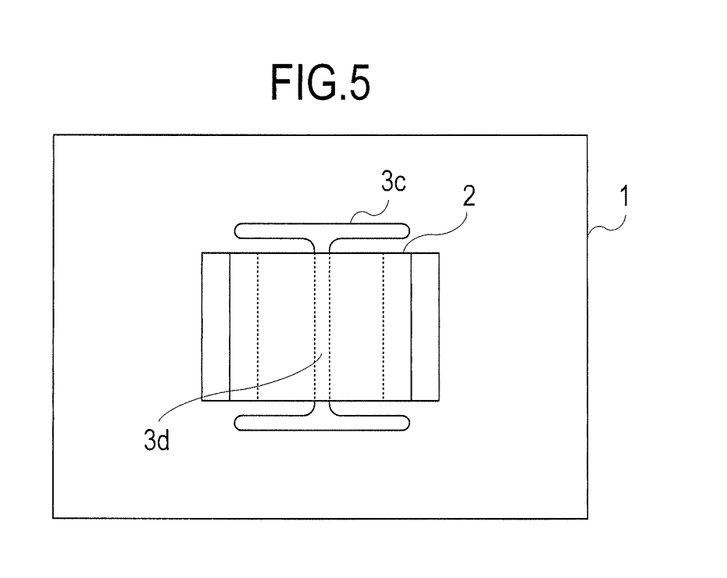
FIG. 5 is a plane explanatory view of a circuit component provided on a substrate of an oven controlled crystal oscillator according to the fifth embodiment.

[Fifth Embodiment: FIG. 5]

Next, an oven controlled crystal oscillator (the fifth oscillator) according to the fifth embodiment is described with reference to FIG. 5. FIG. 5 is a plane explanatory view of a circuit component provided on a substrate of the oven controlled crystal oscillator according to the fifth embodiment.

As shown in FIG. 5, a large-sized circuit component 2 is soldered on a substrate 1 of the fifth oscillator, slits 3c are formed in parallel along long sides of the large-sized circuit component 2, and a slit 3d that connects the slits 3c, which are provided in parallel, with each other below and at a center of the large-sized circuit component 2 is formed.

Due to the slits 3c and 3d, a distortion of the substrate 1 by a heat cycle is relaxed, thereby resulting in that an occurrence of cracks in an applied solder of the large-sized circuit component 2 can be reduced and reliability can be improved.

Figure 6:
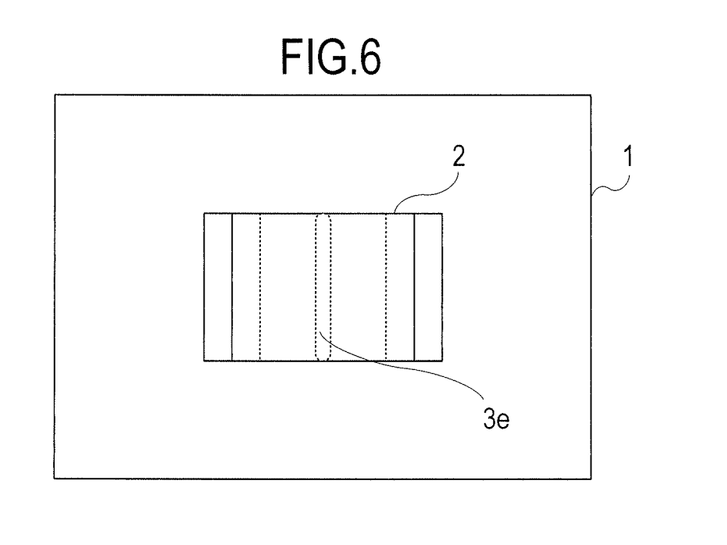
FIG. 6 is a plane explanatory view of a circuit component provided on a substrate of an oven controlled crystal oscillator according to the sixth embodiment.

[Sixth Embodiment: FIG. 6]

Next, an oven controlled crystal oscillator (the sixth oscillator) according to the sixth embodiment is described with reference to FIG. 6. FIG. 6 is a plane explanatory view of a circuit component provided on a substrate of the oven controlled crystal oscillator according to the sixth embodiment.

As shown in FIG. 6, a large-sized circuit component 2 is soldered on a substrate 1 of the sixth oscillator, and a slit 3e is formed below and at a center of the large-sized circuit component 2.

Due to the slit 3e, a distortion of the substrate 1 by a heat cycle is relaxed, thereby resulting in that an occurrence of cracks in an applied solder of the large-sized circuit component 2 can be reduced and reliability can be improved.

Figure 7:
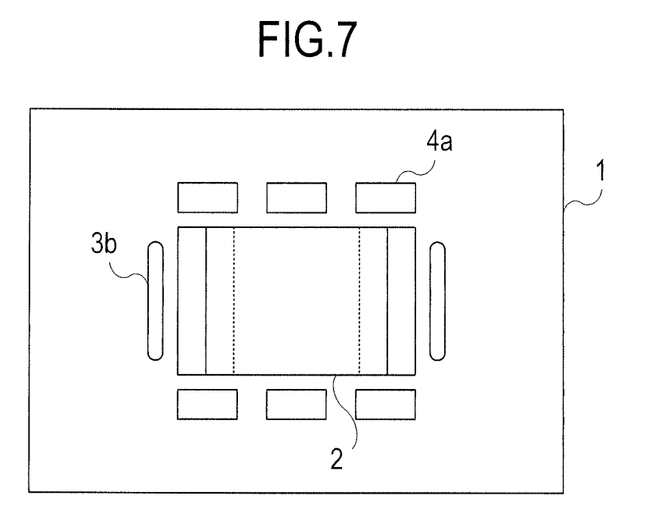
FIG. 7 is a plane explanatory view of a circuit component provided on a substrate of an oven controlled crystal oscillator according to the seventh embodiment.

[Seventh Embodiment: FIG. 7]

Then, an oven controlled crystal oscillator (the seventh oscillator) according to the seventh embodiment is described with reference to FIG. 7. FIG. 7 is a plane explanatory view of a circuit component provided on a substrate of the oven controlled crystal oscillator according to the seventh embodiment.

As shown in FIG. 7, a large-sized circuit component 2 is soldered on a substrate 1 of the seventh oscillator, slits 3b are formed in parallel along short sides of the large-sized circuit component 2, and a plurality of small circuit components (small-sized circuit components) 4a are disposed along long sides of the large-sized circuit component 2.

The small-sized circuit components 4a are ceramic capacitors, ceramic resistors (chip resistors), or the like. The plurality of small-sized circuit components 4a are disposed along the long sides of the large-sized circuit component 2, and are fixed to the substrate 1 by soldering.

In FIG. 7, it is important that the small-sized circuit components 4a are disposed around the large-sized circuit component 2 in a regular manner. The small-sized circuit components 4a may be connected electrically, or may be dummy electronic components, which are not connected electrically.

A distance between the large-sized circuit component 2 and each of the small-sized circuit components 4a is about 0.05 mm to 1 mm. If the distance is long, a space will be wasted, but if the distance is short, a problem may occur in mounting accuracy. In view of this, the distance is preferably about 0.1 mm to 0.3 mm.

In the seventh oscillator, due to the slits 3b and the small-sized circuit components 4a, a distortion of the substrate 1 by a heat cycle is relaxed. This can reduce an occurrence of cracks in an applied solder of the large-sized circuit component 2 and improve reliability.

In FIG. 7, the reason why, instead of forming slits in parallel to the long sides of the large-sized circuit component 2, the small-sized circuit components 4a are arranged in parallel to the long sides of the large-sized circuit component 2 is because such a configuration is highly convenient when any of the small-sized circuit components is used for electric connection.

Figure 8:
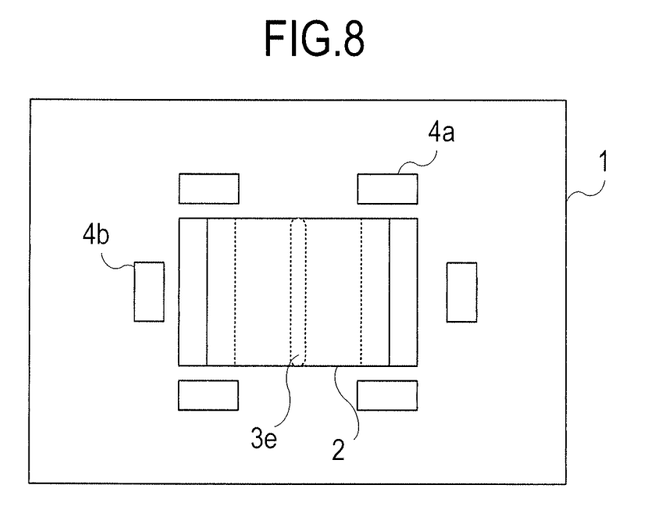
FIG. 8 is a plane explanatory view of a circuit component provided on a substrate of an oven controlled crystal oscillator according to the eighth embodiment.

[Eighth Embodiment: FIG. 8]

Then, an oven controlled crystal oscillator (the eighth oscillator) according to the eighth embodiment is described with reference to FIG. 8. FIG. 8 is a plane explanatory view of a circuit component provided on a substrate of the oven controlled crystal oscillator according to the eighth embodiment.

As shown in FIG. 8, a large-sized circuit component 2 is soldered on a substrate 1 of the eighth oscillator, a slit 3e is formed below and at a center of the large-sized circuit component 2, and small-sized circuit components 4a and 4b are disposed around the large-sized circuit component 2.

More specifically, the small-sized circuit components 4a are disposed in parallel along long sides of the large-sized circuit component 2, and the small-sized circuit components 4b are disposed in parallel along short sides of the large-sized circuit component 2.

A distance between the large-sized circuit component 2 and each of the small-sized circuit components 4a and 4b is about the same as in the seventh embodiment.

In accordance with the eighth oscillator, due to the slit 3e and the small-sized circuit components 4a and 4b, a distortion of the substrate 1 by a heat cycle is relaxed. This can reduce an occurrence of cracks in an applied solder of the large-sized circuit component and improve reliability.

Further, the configuration of the eighth oscillator is highly convenient when any of the small-sized circuit components 4a and 4b thus disposed is used for electric connection.

Figure 9:
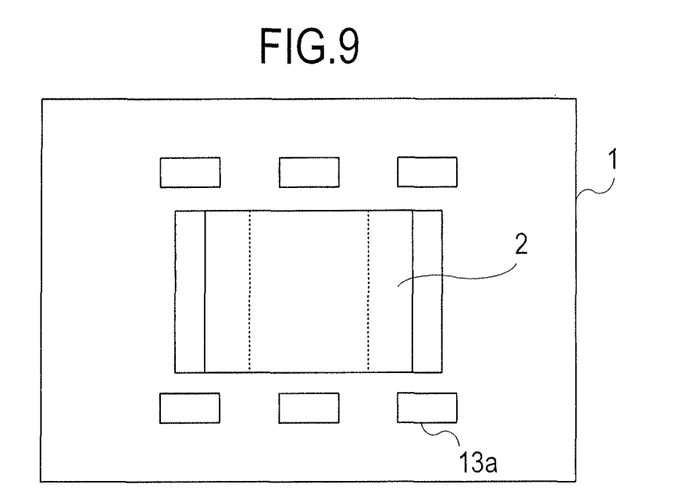
FIG. 9 is a plane explanatory view of a circuit component provided on a substrate of an oven controlled crystal oscillator according to the ninth embodiment.

[Ninth Embodiment: FIG. 9]

An oven controlled crystal oscillator according to the ninth embodiment of the present invention is described with reference to FIG. 9. FIG. 9 is a plane explanatory view of a circuit component provided on a substrate of the oven controlled crystal oscillator according to the ninth embodiment.

In FIG. 9, for convenience of explanation, a single large-sized circuit component 2 is provided on a small substrate 1, so that the figure is simplified. However, on an actual substrate 1, a crystal resonator, a plurality of large and small circuit components, and the like are provided. Similarly, FIGS. 10 to 12 describe drawings in a similar purpose.

A substrate of the oven controlled crystal oscillator (the ninth oscillator) according to the ninth embodiment is configured such that as shown in FIG. 9, a large circuit component (a large-sized circuit component) 2 is mounted, by soldering, on a substrate 1 made of a glass epoxy resin or the like, and a plurality of small circuit components (small-sized circuit components) 13a are provided along long sides of the large-sized circuit component 2.

The large-sized circuit component 2 is a capacitor, a resistor, an inductor, a thermistor, a semiconductor or a crystal resonator, and is fixed to the substrate 1 by soldering.

More specifically, as shown in FIGS. 13 and 14, the soldering is performed on pedal parts of the large-sized circuit component 2.

The small-sized circuit components 13a are ceramic capacitors (chip capacitors), ceramic resistors (chip resistors), or the like. The plurality of small-sized circuit components 13a are disposed along long sides of the large-sized circuit component 2, and fixed to the substrate 1 by soldering.

In FIG. 9, it is important that the small-sized circuit components 13a are placed around the large-sized circuit component 2 in a regular manner. The small-sized circuit components 13a may be connected electrically, and may be dummy electronic components, which are not connected electrically.

A distance between the large-sized circuit component 2 and each of the small-sized circuit components 13a is about 0.05 mm to 1 mm. If the distance is long, a space will be wasted, but if the distance is short, a problem may occur in mounting accuracy. In view of this, the distance is preferably about 0.1 mm to 0.3 mm.

Figure 10:
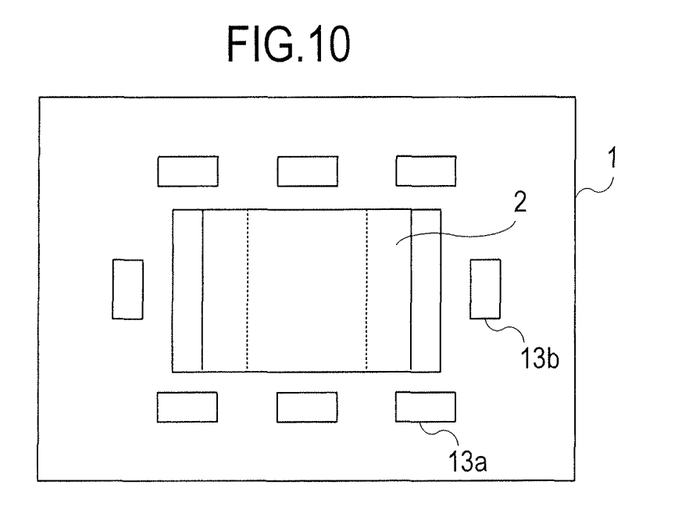
FIG. 10 is a plane explanatory view of a circuit component provided on a substrate of an oven controlled crystal oscillator according to the tenth embodiment.

[Tenth Embodiment: FIG. 10]

Then, an oven controlled crystal oscillator (the tenth oscillator) according to the tenth embodiment is described with reference to FIG. 10. FIG. 10 is a plane explanatory view of a circuit component provided on a substrate of the oven controlled crystal oscillator according to the tenth embodiment.

As shown in FIG. 10, small-sized circuit components 13a and 13b are disposed on a substrate 1 of the tenth oscillators so as to surround a large-sized circuit component 2.

Here, either of the small-sized circuit components 13a and 13b may be dummy electronic components.

More specifically, three small-sized circuit components 13a are disposed along either long side of the large-sized circuit component 2, similarly to FIG. 9, while a single small-sized circuit component 13b is disposed along either short side of the large-sized circuit component 2.

In comparison with FIG. 9, the small-sized circuit components 13a and 13b are disposed so as to surround the large-sized circuit component 2. This makes it possible to reduce an occurrence of cracks in an applied solder of the large-sized circuit component 2.

Figure 11:
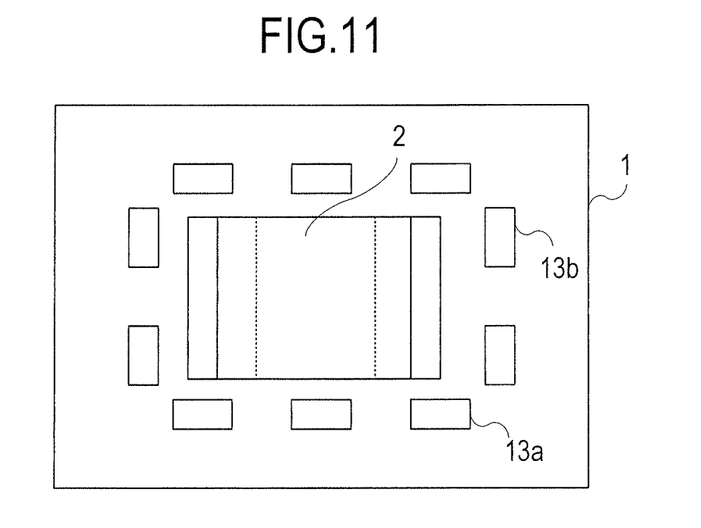
FIG. 11 is a plane explanatory view of a circuit component provided on a substrate of an oven controlled crystal oscillator according to the eleventh embodiment.

[Eleventh Embodiment: FIG. 11]

Then, an oven controlled crystal oscillator (the eleventh oscillator) according to the eleventh embodiment is described with reference to FIG. 11. FIG. 11 is a plane explanatory view of a circuit component provided on a substrate of the oven controlled crystal oscillator according to the eleventh embodiment.

As shown in FIG. 11, small-sized circuit components 13a and 13b are disposed on a substrate 1 of the eleventh oscillator so as to surround a large-sized circuit component 2.

Here, either of the small-sized circuit components 13a and 13b may be dummy electronic components.

More specifically, three small-sized circuit components 13a are disposed along either long side of the large-sized circuit component 2, while two small-sized circuit components 13b are also disposed along either short side of the large-sized circuit component 2.

In comparison with FIG. 9, the small-sized circuit components 13a and 13b are disposed so as to surround the large-sized circuit component 2. This makes it possible to reduce an occurrence of cracks in an applied solder of the large-sized circuit component 2.

Figure 12:
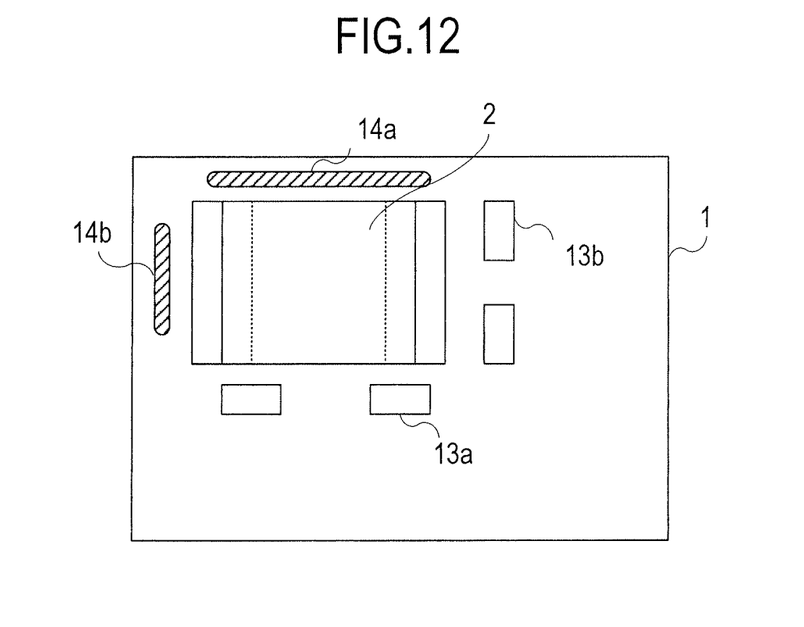
FIG. 12 is a plane explanatory view of a circuit component provided on a substrate of an oven controlled crystal oscillator according to the twelfth embodiment.

[Twelfth Embodiment: FIG. 12]

Then, an oven controlled crystal oscillator (the twelfth oscillator) according to the twelfth embodiment is described with reference to FIG. 12. FIG. 12 is a plane explanatory view of a circuit component provided on a substrate of the oven controlled crystal oscillator according to the twelfth embodiment.

FIG. 12 shows a case where, on a substrate 1 of the twelfth oscillator, a large-sized circuit component 2 is disposed at an end part of the substrate 1, so that there is no space, on one of long sides and one of short sides, to dispose small-sized circuit components 13a and 13b.

In view of this, in the twelfth oscillator, slits (ditches) 14a, 14b are formed in the space where the small-sized circuit components 13a and 13b cannot be disposed, and the small-sized circuit components 13a and 13b are disposed in an area where they can be disposed.

Here, either of the small-sized circuit components 13a and 13b may be dummy electronic components.

Note that, the slits have a width of around 0.1 mm to 1.5 mm, for example. In view of the present circuit scale, a width of around 0.6 mm to 0.8 mm is reasonable, and they are formed to penetrate through the substrate 1.

By forming the slits 14a and 14b on the substrate 1 in such a space where the small-sized circuit components 13a and 13b cannot be disposed, a distortion of the substrate 1 by a heat cycle is relaxed. As a result, it is possible to obtain an effect equivalent to the effect obtained when the small-sized circuit components 13a and 13b are disposed in that space.

[Effects of Embodiments]

According to the first to eighth oscillators, by forming any of the slits 3a to 3e on the substrate around or below the large-sized circuit component 2 soldered on the substrate 1, the distortion of the substrate 1 caused due to expansion and contraction by a heat cycle thereof is relaxed. This yields such an effect that the occurrence of cracks in the applied solder of the large-sized circuit component 2 can be reduced and reliability can be improved.

Further, according to the seven and eight oscillators, by disposing any of the small-sized circuit components 4a and 4b in an area which is around the large-sized circuit component 2 and in which no slit is formed, the distortion of the substrate 1 caused due to expansion and contraction by a heat cycle thereof is relaxed. This yields such an effect that the occurrence of cracks in the applied solder of the large-sized circuit component 2 can be reduced and reliability can be improved.

According to the ninth to eleventh oscillators, by disposing any of the small-sized circuit components 13a and 13b around the large-sized circuit component 2 soldered on the substrate 1, the distortion of the substrate 1 caused due to expansion and contraction by a heat cycle thereof is relaxed. This yields such an effect that the occurrence of cracks in the applied solder of the large-sized circuit component 2 can be reduced and reliability can be improved.

According to the twelfth oscillator, the slits 14a and 14b are formed in that area, around the large-sized circuit component 2, where the small-sized circuit components 13a and 13b cannot be disposed. Due to the slits 14a and 14b and the small-sized circuit components 13a and 13b, the distortion of the substrate 1 caused due to expansion and contraction by a heat cycle thereof is relaxed. This yields such an effect that the occurrence of cracks in the applied solder of the large-sized circuit component 2 can be reduced and reliability can be improved.

The present invention is suitable for an oven controlled crystal oscillator which can reduce the occurrence of cracks in an applied solder of a large-sized circuit component and improve reliability.

What is claimed is:

1. An oven controlled crystal oscillator, wherein:
a circuit component is provided on a substrate, a plurality of small-sized circuit components, which are smaller than the circuit component, are disposed around the circuit component, and for the plurality of small-sized circuit components, an electronic component, which is electrically connected to the circuit component, and a dummy electronic component, which is not electrically connected to the circuit component, are provided.

2. The oven controlled crystal oscillator according to claim 1, wherein a distance between the circuit component and each of the small-sized circuit components is 0.05 mm to 1 mm.

3. The oven controlled crystal oscillator according to claim 1, wherein a distance between the circuit component and each of the small-sized circuit components is 0.1 mm to 0.3 mm.

4. The oven controlled crystal oscillator according to claim 1, wherein the small-sized circuit components are disposed along long sides of the circuit component.

5. The oven controlled crystal oscillator according to claim 1, wherein in an area where there is no space to dispose any small-sized circuit components, slits are provided instead of disposing the small-sized circuit components.

6. The oven controlled crystal oscillator according to claim 1, wherein the small-sized circuit components are ceramic capacitors or ceramic resistors.

7. The oven controlled crystal oscillator according to claim 1, wherein the circuit component around which the small-sized circuit components are disposed is a capacitor, a resistor, an inductor, a thermistor, a semiconductor or a crystal resonator.

* * * * *